United States Patent
Canada et al.

(10) Patent No.: US 7,042,776 B2
(45) Date of Patent: May 9, 2006

(54) METHOD AND CIRCUIT FOR DYNAMIC READ MARGIN CONTROL OF A MEMORY ARRAY

(75) Inventors: Miles G. Canada, Colchester, VT (US); Stephen F. Geissler, Underhill, VT (US); Robert M. Houle, Williston, VT (US); Dongho Lee, Poughkeepsie, NY (US); Vinod Ramadurai, South Burlington, VT (US); Mathew I. Ringler, Burlington, VT (US); Gerard M. Salem, Essex Junction, VT (US); Timothy J. Vonreyn, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/708,236

(22) Filed: Feb. 18, 2004

(65) Prior Publication Data

US 2005/0180228 A1 Aug. 18, 2005

(51) Int. Cl.
*G11C 7/00* (2006.01)

(52) U.S. Cl. .................. 365/194; 365/230.06; 365/207

(58) Field of Classification Search ................ 365/194, 365/207, 189.01, 205, 233
See application file for complete search history.

(56) References Cited

U.S. PATENT DOCUMENTS

| | | | |
|---|---|---|---|
| 5,446,695 A | 8/1995 | Douse et al. ............... 365/222 |
| 5,542,067 A * | 7/1996 | Chappell et al. ............. 365/233 |
| 5,703,823 A | 12/1997 | Douse et al. ................ 365/222 |
| 5,835,421 A | 11/1998 | Pham et al. ........... 365/189.02 |
| 5,875,135 A | 2/1999 | Patwardhan et al. ........ 365/194 |
| 6,047,248 A | 4/2000 | Georgiou et al. ........... 702/132 |
| 6,108,266 A | 8/2000 | Weier et al. ........... 365/230.08 |
| 6,172,530 B1 * | 1/2001 | Bull et al. ................... 365/203 |
| 6,269,045 B1 * | 7/2001 | Durham et al. ........ 365/230.06 |
| 6,301,183 B1 | 10/2001 | Bondurant et al. ......... 365/222 |
| 6,334,167 B1 | 12/2001 | Gerchman et al. .......... 711/106 |
| 6,366,990 B1 * | 4/2002 | Guddat et al. .............. 711/167 |
| 6,577,548 B1 | 6/2003 | Barth, Jr. et al. ........... 365/210 |
| 6,640,266 B1 | 10/2003 | Arcoleo et al. ................ 710/35 |
| 6,657,912 B1 | 12/2003 | Correale, Jr. et al. ....... 365/227 |
| 6,873,568 B1 * | 3/2005 | Demone ...................... 365/233 |
| 6,885,610 B1 * | 4/2005 | Takayanagi ................. 365/233 |
| 2003/0026150 A1 | 2/2003 | Rimondi |
| 2003/0112680 A1 | 6/2003 | Nirschl |
| 2003/0126172 A1 | 7/2003 | Chren, Jr. |
| 2004/0202014 A1 * | 10/2004 | Palmer et al. ............... 365/154 |

* cited by examiner

*Primary Examiner*—Thong Q. Le
(74) *Attorney, Agent, or Firm*—Schmeiser, Olsen & Watts; Michael LeStrange (57) ABSTRACT

A method and circuit for adjusting the read margin of a self-timed memory array. The electronic circuit, including: a memory cell array including a sense amplifier self-timed decode circuit adapted to set a base read time delay of the memory cell array; and a read delay adjustment circuit coupled to the memory cell array, the read delay adjustment circuit adapted to adjust the base read time delay of the memory array based on an operating frequency of the memory cell array.

14 Claims, 5 Drawing Sheets

METHOD AND CIRCUIT FOR DYNAMIC READ MARGIN CONTROL OF A MEMORY ARRAY

BACKGROUND OF INVENTION

1. Field of the Invention

The present invention relates to the field of integrated circuit memory; more specifically, it relates to a method and circuit for dynamically changing the read margin of a memory array.

2. Background of the Invention

High performance microprocessors are designed to operate at high frequency and high voltage in high performance mode. High performance microprocessors utilize internal high performance self-timed cache memory to minimize the time required to access instructions or data as well as self-timed general-purpose memory. In battery-operated devices such as notebook computers, personal computers, handheld personal digital assistants (PDAs) and cell phones, utilizing high performance microprocessors and self-timed memories, the power consumed the device can be significant and low power modes would be highly desirable. However, current self-timed memories designed for high performance operation present signal timing problems in low power mode, precluding low power operation of the microprocessors. The same problem exists for high performance devices utilizing general-purpose memory designed for high performance.

Therefore, there is a need for a method for reducing the power consumption of microprocessors containing onboard memories as well as reducing the power consumption of general-purpose memories by adapting the memories to support operation at low voltages.

SUMMARY OF INVENTION

A first aspect of the present invention is an electronic circuit, comprising: a memory cell array including a sense amplifier self-timed decode circuit adapted to set a base read time delay of the memory cell array; and a read delay adjustment circuit coupled to the memory cell array, the read delay adjustment circuit adapted to adjust the base read time delay of the memory array based on an operating frequency of the memory cell array.

A second aspect of the present invention is a method for adjusting the read margin of a self-timed memory, comprising: providing the self-timed memory, the self-timed memory adapted to generate a base read time delay; and providing the self-timed memory with a read delay adjustment circuit, the read delay adjustment circuit adapted to adjust the base read time delay in order to increase or decrease the read margin of the self-timed memory.

A third aspect of the present invention is a method for adjusting the read margin of a self-timed memory, comprising: providing a memory cell array including a sense amplifier self-timed decode circuit for setting a base read time delay of the memory cell array; and providing a read delay adjustment circuit coupled to the memory cell array, the read delay adjustment circuit for adjusting the base read time delay of the memory array based on an operating frequency of the memory cell array.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

The terms high performance mode and low power mode are defined relative to one another. In high performance mode a circuit (which includes memory arrays and microprocessors) operates at a frequency and power supply voltage that is higher than the frequency and operating voltage in low power mode. In low power mode a circuit operates at a frequency and power supply voltage that is lower than the frequency and operating voltage in high performance mode. A self-timed memory is defined as a memory array where the timings of all internal signals are self-generated within the memory itself. In a self-timed memory, read time delay is defined as the time differential between the time when wordlines are turned on and the time the sense amplifiers on the bitlines are turned on. In a self-timed memory, read margin is defined as the voltage on a bitline or the differential voltage on a true/complement bitline pair when the sense amplifiers are turned on.

Figure 1:
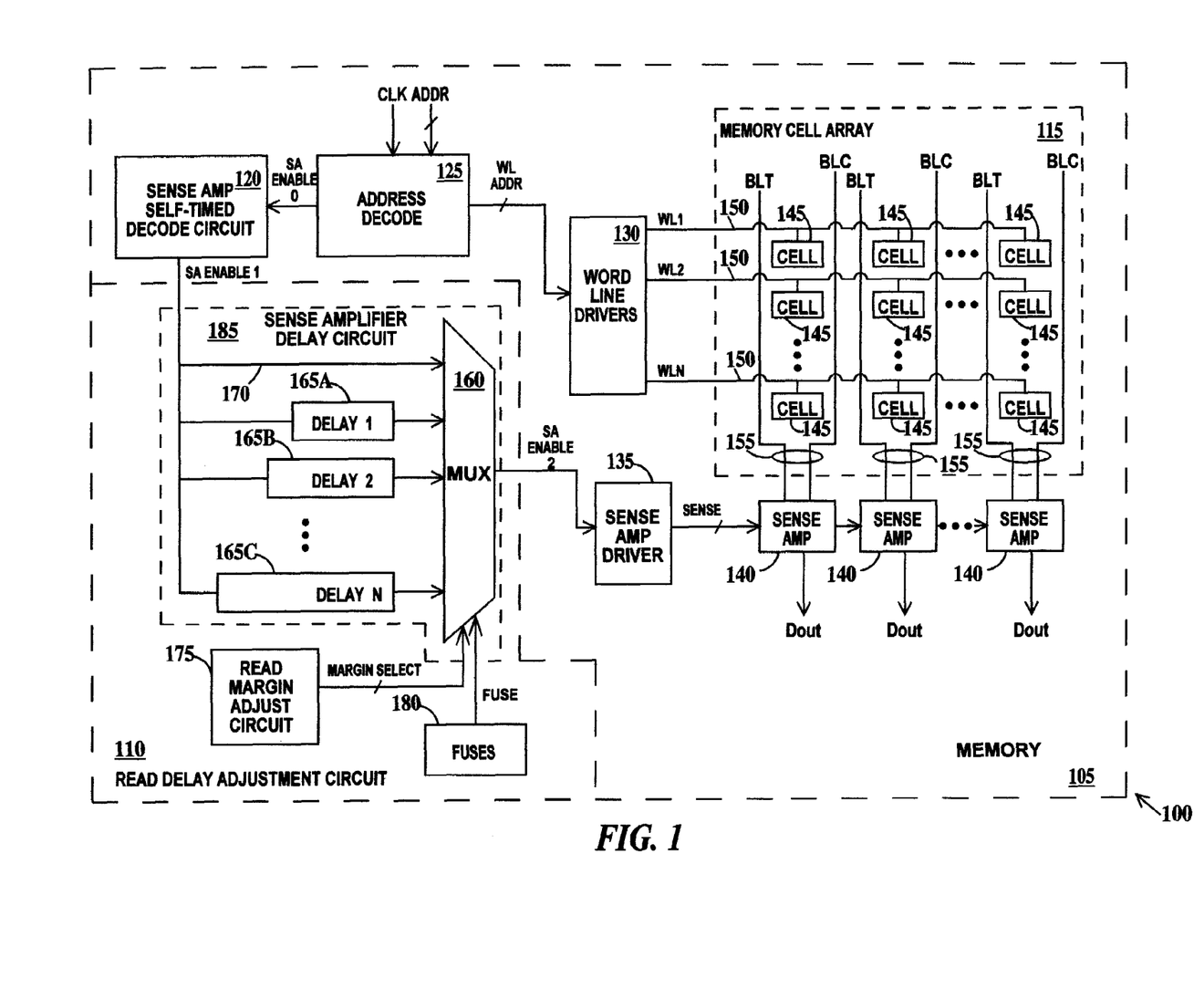
FIG. 1 is an exemplary block schematic diagram for dynamically changing the read time delay of a memory in response to changes in operating frequency of the memory according to the present invention.

FIG. 1 is an exemplary block schematic diagram for dynamically changing the read time delay of a memory in response to changes in operating frequency of the memory according to the present invention. In FIG. 1, an electronic memory 100 includes a self-timed memory 105 and a read delay adjustment circuit 110. Memory 105 includes a memory cell array 115, a sense amplifier self-timed decode circuit 120, an address decoder 125, a word line drivers 130, a sense amplifier driver 135 and a multiplicity of differential sense amplifiers 140. In one example memory cell array 115 may comprise dynamic random access memory (DRAM). In another example memory cell array 115 may comprise static random access memory (SRAM).

Memory cell array 115 includes a multiplicity of memory cells 145 arranged in an array of rows and columns. Rows of memory cells 145 are connected to word line drivers 130 by wordlines 150 carrying wordline signals WL1 through WLN. In some designs, multiple wordlines may be connected to the same rows of memory cells 145. Columns of memory cells 145 are connected to bitline true (BLT) and bitline complement (BLC) bitline pairs 155. In some designs, multiple bitline pairs may be connected to the same columns of memory cells 145. Each bitline pair 155 is connected to a differential sense amplifier 140. Bitline pairs 155 carry data into and out of memory cell array 115 and wordlines 150 allow selection of which rows of memory cells 145 data is to be written to or read out from. Differential sense amplifiers 140 amplify the voltage level of data signals on bitline pairs 155 and generate data out signals (Dout).

Figure 2A:
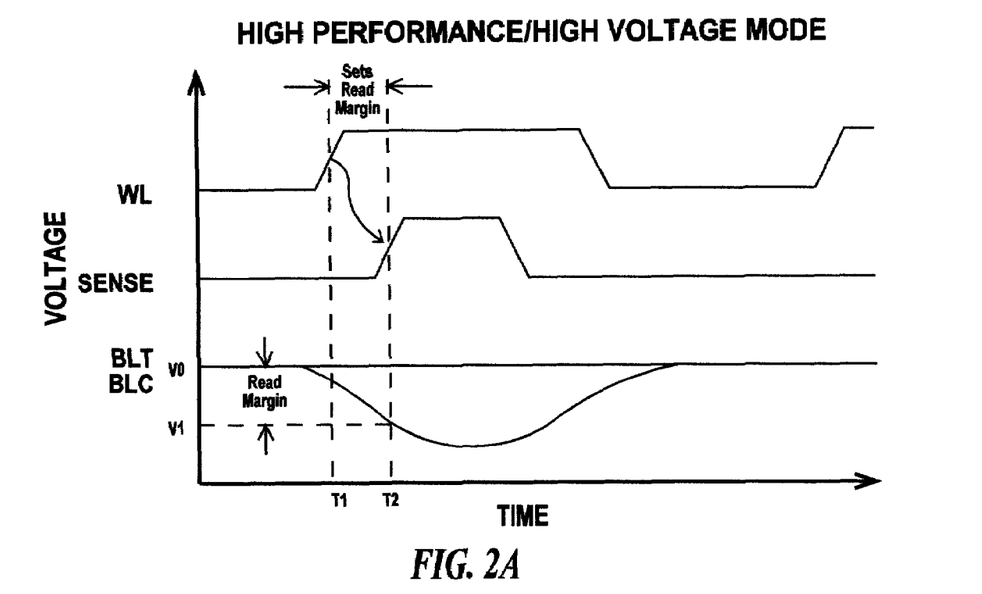
FIG. 2A is a timing diagram illustrating the relationship between various signals of the circuit of FIG. 1 in high performance mode.

The turn on of differential sense amplifiers 140 is coordinated with the turning on of any wordline 150 as illustrated in FIG. 2A and described infra. Address decoder 125 receives a clock signal CLK (at the operating frequency) as well as an address signal (ADDR) and generates a wordline address signal WL ADDR, which received by wordline drivers 130 and used to turn on or off wordline signals WL1 through WLN corresponding to the information contained in WL ADDR. Address decoder 125 also generates an SA ENABLE 0 signal triggered by generation of WL ADDR. SA ENABLE 0 is received by sense amplifier self-timed decode circuit 120, which in turn generates a self-timed, base read time delay signal, SA ENABLE 1. SA ENABLE 1 is thus a time delayed SA ENABLE 0 signal. The time delay introduced by sense amplifier self-timed decode circuit 120 is used to delay turn-on of differential sense amplifiers 140 until the difference between voltages on bitline pairs 155 has had time to rise to a predetermined level as illustrated in FIG. 2A and described infra.

Figure 2B:
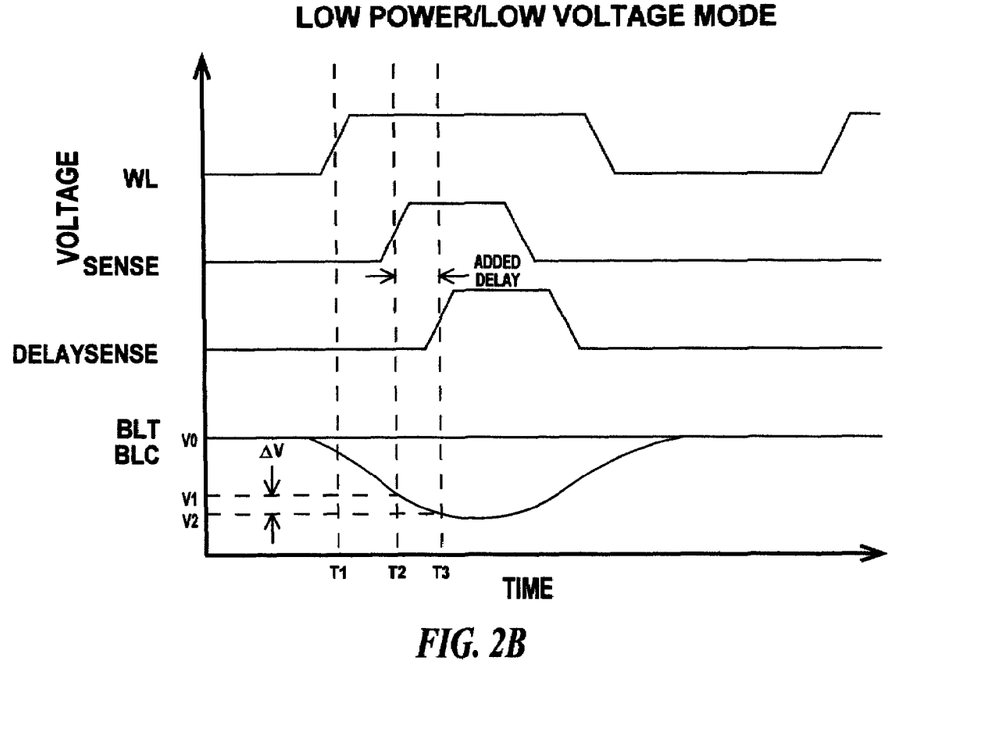
FIG. 2B is a timing diagram illustrating the relationship between various signals of the circuit of FIG. 1 in low power mode.

In prior art circuits SA ENABLE 1 is applied directly to sense amplifier driver 135, which generates a SENSE signal used to turn on or turn off specific differential amplifiers 140. However, in the present invention, SA ENABLE 1 is routed through read delay adjustment circuit 110. Read delay adjustment circuit 110 adjusts the read margin of memory 105 by adjusting the base read time delay (SA ENABLE 1) as illustrated in FIGS. 2A and 2B and described infra.

Read delay adjustment circuit 110 adds none to more delay time to SA ENABLE 1 and generates an SA ENABLE 2 signal, which is received by sense amplifier driver 135 and used to generate the SENSE signal described supra. The amount of additional delay time, if any, added to SA ENABLE 1 is a function of the current operating frequency and current operating voltage of the device containing electronic memory 100. In the case of a microprocessor, electronic memory 100 may be a cache memory and read delay adjustment circuit 110 thus changes the read margin of memory 105 in response to changes in operating frequency and voltage (e.g. high performance mode to low power mode) of the microprocessor.

Read delay adjustment circuit 110 includes a multiplexer 160, one or more delay circuits 165, a non-delay path 170 a read margin adjustment circuit 175 and fuses 180. Multiplexer 160, delays 165A, 165B through 165N and non-delay path 170 may be considered as but one example of a sense amplifier delay circuit 185 for adding none to some predetermined amount of additional delay time to SA ENABLE 1.

SA ENABLE 1 is applied directly to one data input of multiplexer 160 as well as to each delay circuit 165A through 165N. Each delay circuit 165A through 165N adds a different and progressively higher amount of delay to SA ENABLE 1. In one example, delay circuits 165A through 165N are comprised of serially coupled buffers and/or inverters. The output of multiplexer 160 is signal SA ENABLE 2. There are two select inputs to multiplexer 160. Fuses 180 are connected to one select input. Fuses 180 are programmed (via a fuse blow process) to generate a FUSE signal in order to set a base delay to add to SA ENABLE 1 for use in high performance mode by selection of one of the inputs to multiplexer 160. This base delay may range from none to a maximum amount of additional delay time available. Thus not only can read delay adjustment circuit 180 be used to control read margin, but it can also be used to set a maximum operating frequency specification for electronic memory 100.

Figure 3A:
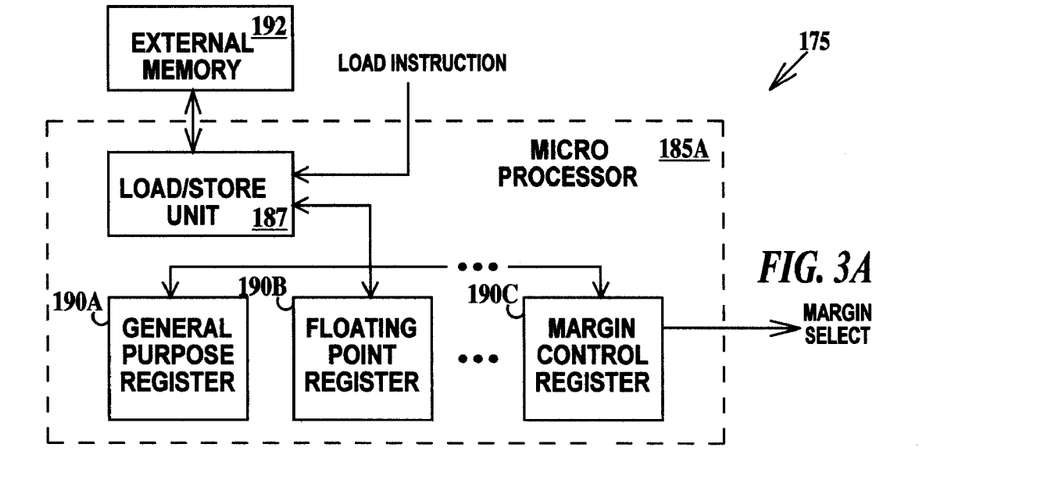
FIG. 3A is a block schematic diagram of a first embodiment of a margin circuit signal of FIG. 1.
Figure 3B:
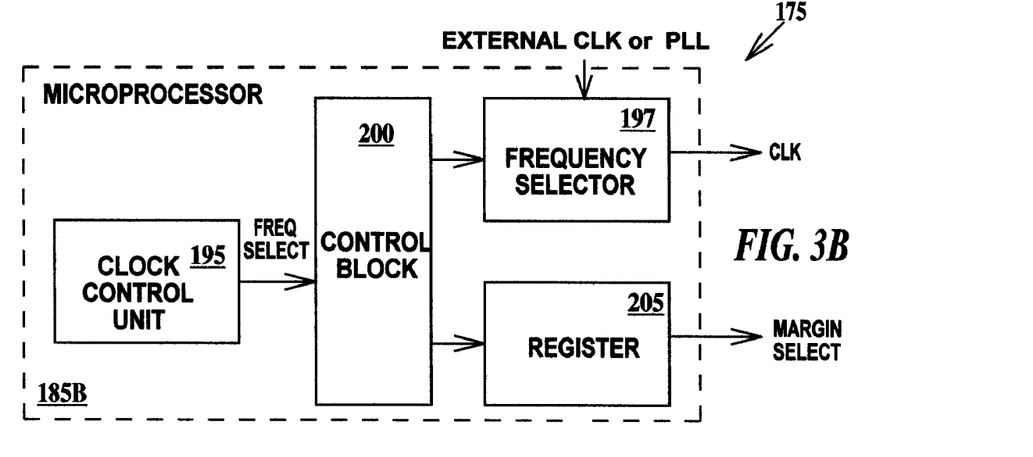
FIG. 3B is a block schematic diagram of a second embodiment of a margin circuit signal of FIG. 1.
Figure 3C:
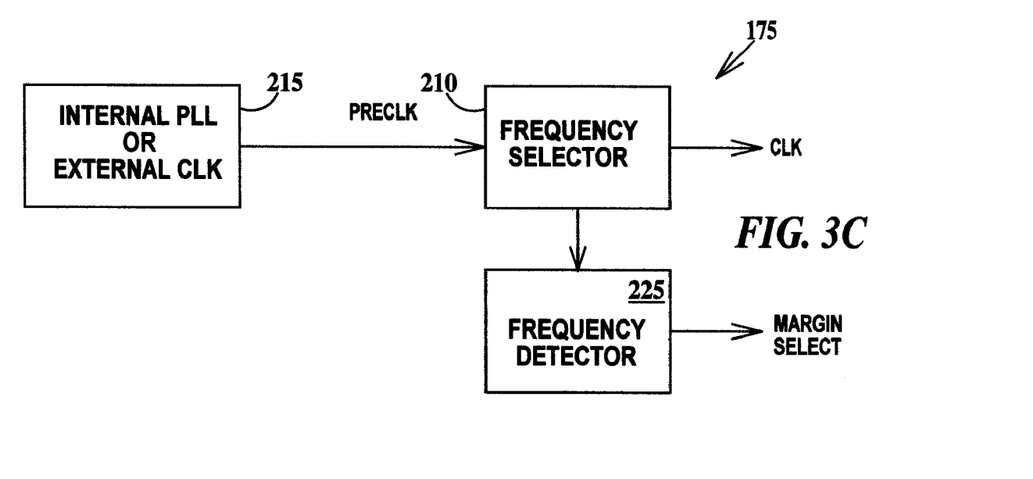
FIG. 3C is a block schematic diagram of a third embodiment of a margin circuit signal of FIG. 1.

The output of read margin adjustment circuit 175, a MARGIN SELECT signal, is coupled to the second select input of multiplexer 160. The MARGIN SELECT signal causes multiplexer 160 to disregard the FUSE signal and select any input to multiplexer 160. Read margin adjustment circuit senses changes in operating frequency in order to generate an appropriate MARGIN SELECT signal. Various examples of read margin adjustment circuit 175 are illustrated in FIGS. 3A, 3B and 3C and described infra.

FIG. 2A is a timing diagram illustrating the relationship between various signals of the circuit of FIG. 1 in high performance mode. In FIG. 2A (and in FIG. 2B as well) turn on and turn off of a signal are picked as occurring at the 50% point of the rise or fall of the signal. In FIG. 2A, wordline (WL) goes high (turns on) at time T1 and SENSE goes high (turns on) on at a later time T2. In FIG. 2A, is it useful to think of SENSE as being SA ENABLE 2=SA ENABLE 1 (see FIG. 1). The difference between (T2−T1) sets or determines the read margin. (T2−T1) is the time delay between the wordline going high and the differential sense amplifiers 140 (see FIG. 1) turning on. The read margin (V1−V0) is the difference in voltage between BLT and BLC of a bit-line pair 140 (see FIG. 1) when SENSE goes high. As can be seen from FIG. 2A, the difference in voltage between BLT and BLC is greater at T2 than at T1.

Without any additional delay time between WL going high and SENSE going high, the difference in voltage between BLT and BLC may be below or just marginally above the voltage differential sense amplifiers 140 (see FIG. 1) can detect and thus the Dout signal (see FIG. 1) may thus not always be correct. Consequently, the read delay time must be set for adequate read margin to develop prior to enabling the bitline amplifiers for correct Dout operation.

FIG. 2B is a timing diagram illustrating the relationship between various signals of the circuit of FIG. 1 in low power mode. Because in low power mode, the operating voltage as well as the operating frequency is reduced, the self-timed base delay may occur at a BLT/BLC voltage difference below or just marginally above the voltage difference differential sense amplifiers 140 (see FIG. 1) can detect since the difference is a function of the operating voltage. (i.e. at an operating voltage of 1.5 volts, the base delay may yield a read margin of 300 mv, but at an operating voltage of 1.2 volts, the base delay may yield a read margin of only 240 mv). If the threshold of differential amplifiers 140 (see FIG. 1) is 250, data will not be read out of memory cell array 115 (see FIG. 1) reliably or repeatability. This case is illustrated in FIG. 2A where the read margin for SENSE signal high at time T2 results in a read margin of (V1−V0) which may be below the differential amplifiers threshold voltage. In FIG. 2B, it is useful to think of SENSE as being SA ENABLE 2=SA ENABLE 1 and DELAYED SENSE being SA ENABLE 2=SA ENABLE 1+DELAY (see FIG. 1). With DELAYSENSE going high at time T3, the read margin is now (V2–V0) which is above the differential amplifiers threshold voltage. The delay required must be accurately determined and repeatability applied when in low power mode. Thus in low power mode DELAYSENSE would be applied to sense amplifier driver 135 (see FIG. 1).

In one example, high performance mode has an operating frequency of 800 MHz and an operating voltage of 1.5 volts and low power mode has an operating frequency of 400 MHz and an operating voltage of 1.2 volts.

FIG. 3A is a block schematic diagram of a first embodiment of a margin circuit signal of FIG. 1. In FIG. 3A read margin adjustment circuit 175 includes a microprocessor 185A comprising a load/store unit 187, typical microprocessor registers such as a general purpose register 190A and a floating point register 190B and a margin control register 190C all coupled to load/store unit 187 by a bus. Load/store unit 187 is coupled to an external memory 192. Load/store unit 187 receives a load instruction generated in anticipation of a change in operating frequency of the microprocessor, causing the load/store unit to transfer data from external memory 192 to margin control register 190C. The latched data is the MARGIN SELECT signal (or may be used to generate MARGIN SELECT with additional circuitry). See also FIG. 1.

Events must occur in a specified order. When the operating frequency is to shift from a higher to a lower value, first the operating frequency is shifted to the lower value, second the load instruction is executed, resulting in an update to margin control register 190C and third the operating voltage is shifted from a higher value to a lower value. When the operating frequency is to shift from a lower to a higher value, first the operating voltage is shifted from a lower to a higher value, second the load instruction the load instruction is executed, resulting in an update to margin control register 190C and third the operating frequency is shifted to the higher frequency value.

Thus in FIG. 3A, the read margin is changed by software and is suitable for use in microprocessors having internal or external cache memory.

FIG. 3B is a block schematic diagram of a second embodiment of a margin circuit signal of FIG. 1. In FIG. 3B read margin adjustment circuit 175 includes microprocessor 185B comprising a clock control unit 195 which generates a FREQ SELECT signal corresponding to the frequency the microprocessor is operating at or changing to a frequency selector 197, a control block 200 and a register 205. FREQ SELECT is coupled through control block 200 to frequency selector 197, which generates the CLK signal (see also FIG. 1) at the operating frequency of the microprocessor from either an external clock signal or an on-board phase lock loop (or equivalent function) circuit. An example of a frequency selector is a digitally selectable frequency divider circuit. FREQ SELECT is also coupled through control block 200 to register 205. The latched FREQ SELECT is the MARGIN SELECT signal (or is used to generate MARGIN SELECT using additional circuits). See also FIG. 1. Control block 200 manages the timing of MARGIN SELECT depending on frequency shift direction (e.g. high to low or low to high).

Events must occur in a specified order. When the operating frequency is to shift from a higher to a lower value, control block 200 ensures that first the operating frequency is shifted to the lower value and then MARGIN SELECT is adjusted. When the operating frequency is to shift from a lower to a higher value, control block 200 ensures that first MARGIN SELECT is adjusted and second that the operating frequency is shifted to the higher frequency value.

Thus in FIG. 3B, the read margin is changed by hardware and is suitable for use in microprocessors having internal or external cache memory.

FIG. 3C is a block schematic diagram of a third embodiment of a margin circuit signal of FIG. 1. In FIG. 3C read margin adjustment circuit 175 includes a frequency selector 210, an internal phase lock loop (PLL) or an external clock 215, which generates the CLK signal and a frequency detector 225. Frequency detector 225 determines the current operating frequency and generates a corresponding MARGIN SELECT (see also FIG. 1). Thus in FIG. 3C, the read margin is changed by hardware and is suitable for use in standalone memory.

Figure 4A:
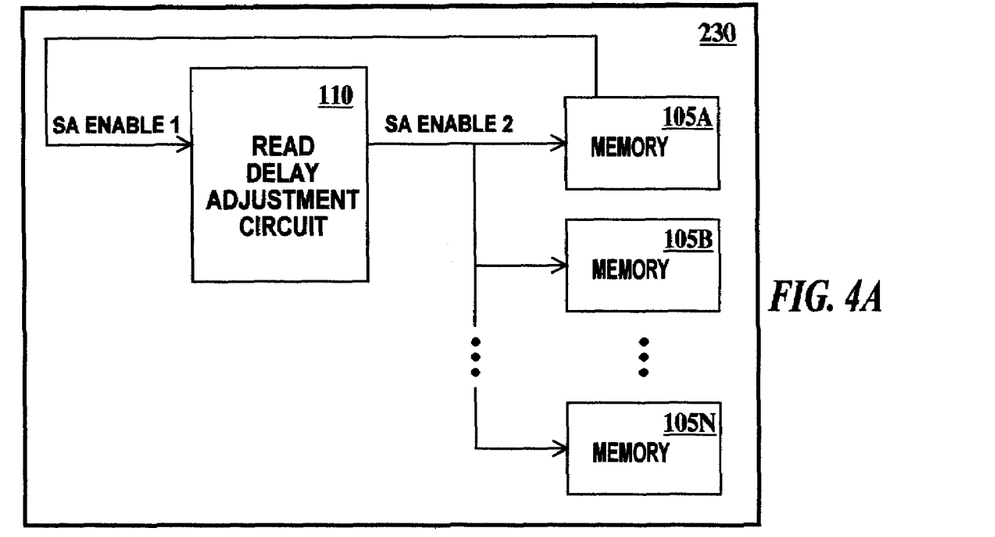
FIG. 4A illustrates a first implementation of the present invention.

FIG. 4A illustrates a first implementation of the present invention. In FIG. 4A, an integrated circuit 230 includes one read margin adjust circuit 110 which receives SA ENABLE 1 from one memory 105 and returns SA ENABLE 2 back to memory 105 as well as coupling SA ENABLE 2 to additional memories 105A through 105N which are similar to memory 105. Thus, all read margins of memories 105 and 105A through 105N are changed together and by the same amount. Note, by inserting different delay elements (i.e. buffers or inverters) in the SA ENABLE 2 path immediately before one or more of memories 105A through 105N, the read margin of each memory could be adjusted independently.

Figure 4B:
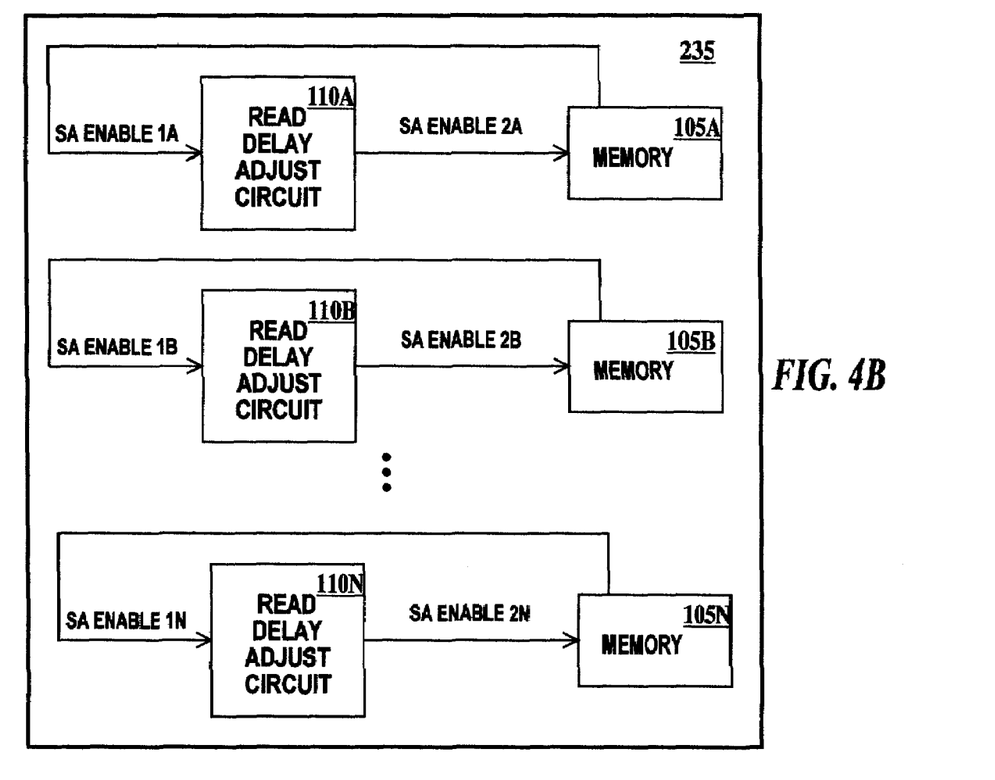
FIG. 4B illustrates a second implementation of the present invention.

FIG. 4B illustrates a second implementation of the present invention. In FIG. 4B, an integrated circuit 235 includes multiple read margin adjust circuits 110A, 110B through 110N which receive corresponding SA ENABLE 1A, SA ENABE 1B and SA ENABLE 1N from corresponding memories 105A, 105B through 105N and return corresponding SA ENABLE 2A, SA ENABLE 2B through SA ENABLE 2N back to corresponding memories 105A, 105B through 105N. Thus, individual read margins can be set for memories 105A, 10B through 105N in response to a change in operating frequency.

An integrated circuit utilizing both of the implementations illustrated in FIGS. 4A and 4B is also possible.

Figure 5A:
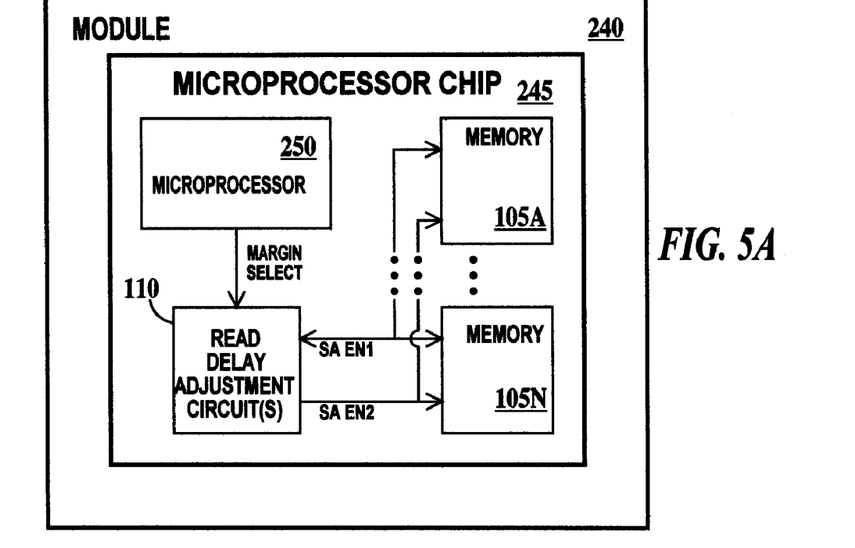
FIG. 5A is pictorial representation of the present invention applied to a microprocessor including internal cache memory.

FIG. 5A is pictorial representation of the present invention applied to a microprocessor including internal cache memory. In FIG. 5A a module 240 includes a microprocessor chip 245 incorporating the present invention. Microprocessor chip 245 includes a microprocessor 250, one or more read delay adjustment circuits 110 and one or more cache memories 105. Microprocessor 250 supplies MARGIN SELECT to read delay adjustment circuit (s) 110. Either or both of the implementations illustrated in FIGS. 4A and 4B may be applied to microprocessor chip 245.

Figure 5B:
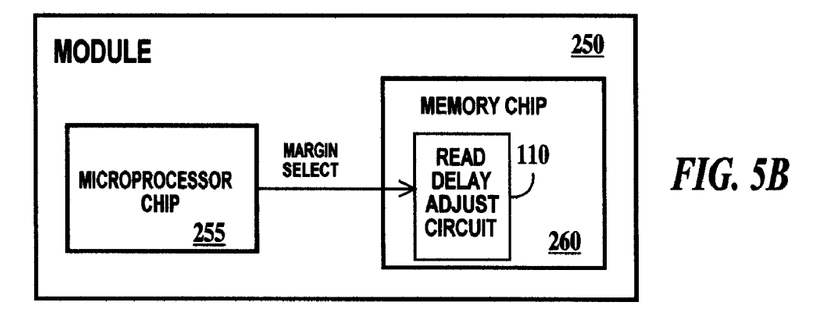
FIG. 5B is pictorial representation of the present invention applied to a module having a microprocessor chip and external cache memory.

FIG. 5B is pictorial representation of the present invention applied to a module having a microprocessor chip and external cache memory. In FIG. 5B, a module 250 includes a microprocessor chip 255 and a cache memory chip 260 (similar to memory 105 of FIG. 1). Cache memory chip includes read delay adjustment circuit 110. Microprocessor chip 255 supplies MARGIN SELECT to read delay adjustment circuit 110. Either or both of the implementations illustrated in FIGS. 4A and 4B may be applied to memory chip 260. For example different portions of memory on memory chip 260 could be run at different operating frequencies and voltages using corresponding and appropriate read margins.

Figure 5C:
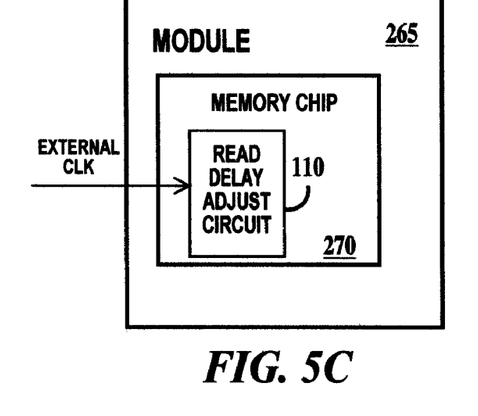
FIGS. 5C and 5D are pictorial representation of the present invention applied to a module having general-purpose memory.
Figure 5D:
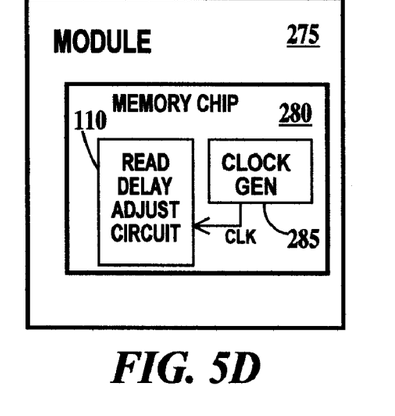

FIGS. 5C and 5D are pictorial representation of the present invention applied to a module having general-purpose memory. In FIG. 5C, a memory module 265 includes a memory chip 270 similar to memory 105 of FIG. 1 and read delay adjustment circuit 110 coupled to an external CLK as described supra In FIG. 5D, a memory module 275 includes a memory chip 280 similar to memory 105 of FIG. 1 and read delay adjustment circuit 110 coupled to clock generator 280.

Thus, the present invention provides a method for reducing the power consumption of microprocessors containing on-board memories as well as reducing the power consumption of general-purpose memories by adapting the memories to support operation at low voltages.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, sorting based on the present invention can reduce yield loss of devices containing memory due to read margin failures. Devices that fail initial testing for read margin can be retested at a different frequency and voltage combination and the read margin of the memory adjusted according to the teachings of the present invention. Therefore, it is intended that the following claims cover all such modifications and changes as fall within the true spirit and scope of the invention.

What is claimed is:

1. An electronic device, comprising:
   a self-timed memory cell array;
   an address decode circuit connected through a wordline driver to wordlines of said self-timed memory cell array and to a sense amplifier self-timed decode circuit read; and
   a read delay adjustment circuit including a sense amplifier delay circuit and a read margin adjustment circuit, said read margin circuit coupled to said sense amplifier delay circuit, an input of said sense amplifier delay circuit coupled to said sense amplifier self-timed decode circuit, an output of said sense amplifier delay circuit coupled to sense amplifiers on bitlines of said self-timed memory cell array through a sense amplifier driver, said read margin adjustment circuit responsive to an operating frequency of said electronic device.

2. The device of claim 1, wherein said read margin adjustment circuit includes:
   a microprocessor including a load instruction register and a margin control register, said microprocessor responsive to a load instruction stored in said load instruction register, said load instruction indicating an operating frequency of said microprocessor, said load instruction register coupled to said margin control register, an output of said margin control register connected to said sense amplifier delay circuit.

3. The device of claim 1, wherein said read margin adjustment circuit includes:
   a microprocessor including a clock control unit and a frequency selector and a margin control register,
   said clock control unit responsive to an operating frequency of said microprocessor, said clock control unit coupled to said frequency selector and to said margin control register,
   an output of said margin control register coupled to said sense amplifier delay circuit.

4. The device of claim 1, wherein said read margin adjustment circuit includes:
   a frequency selection circuit coupled to an internal frequency generation circuit or to an external clock signal; and
   a frequency detector coupled between said frequency selection circuit and said sense amplifier delay circuit.

5. The device of claim 1, further including one or more programmable fuses coupled to said sense amplifier delay circuit, said sense amplifier delay circuit to responsive a slate of said one or more fuses.

6. A method, comprising:
   providing an electronic device, said electronic device including a self-timed memory cell array, an address decode circuit, a sense amplifier self-timed decode circuit and a read delay adjustment circuit, said read delay adjustment circuit including a sense amplifier delay circuit and a read margin adjustment circuit, said address decode circuit coupled through a word line driver to wordlines of said self-timed memory array and to said sense amplifier self-timed decode circuit, said read margin adjustment circuit connected to said sense amplifier delay circuit, said sense amplifier delay circuit connected to said sense amplifier self-timed decode circuit, an output of said sense amplifier delay circuit coupled to through a sense amplifier driver to sense amplifiers coupled to bitlines of said self-timed memory array;
   setting a base read time delay of said self-timed memory cell array; and
   adjusting said base read time delay of said self-timed memory array based on an operating frequency of said electronic device.

7. The method of claim 6, further comprising:
   controlling an amount of delay time added to said base read time delay in response to a margin select signal.

8. The method of claim 7, wherein said read margin adjustment circuit includes a microprocessor including a load instruction register coupled to a margin control register and further comprising:
   executing a load instruction stored in said load instruction register issued in response to a change of value of an operating frequency of said microprocessor and storing data associated with said load instruction in said margin control register, an output of said margin control register coupled to said sense amplifier delay circuit; and
   when said operating frequency is to be decreased, sequentially decreasing said operating frequency, issuing said margin select signal and decreasing said operating voltage in the order recited and when said operating frequency is to be increased, sequentially increasing said operating voltage, issuing said margin select signal and increasing said operating voltage in the order recited.

9. The method of claim 7, wherein said read margin adjustment circuit includes a microprocessor including a clock control circuit coupled to a frequency selector and a margin control register, an output of said margin control register coupled to said sense amplifier delay circuit and further including:
   generating a frequency select signal for selecting an operating frequency of said microprocessor and of said self-timed memory cell array;
   storing said frequency select signal in said margin control register; and
   when said operating frequency is to be decreased, sequentially decreasing said operating frequency, issuing said margin select signal and decreasing said operating voltage in the order recited and when said operating frequency is to be increased, sequentially increasing said operating voltage, issuing said margin select signal and increasing said operating voltage in the order recited.

10. The method of claim 7, wherein said read margin adjustment circuit includes a frequency selection circuit and a frequency detector coupled between said frequency selection circuit and said sense amplifier delay circuit and further comprising:

generating said operating frequency of from an internal frequency generation circuit or from an external clock signal.

11. The method of claim 7, wherein said electron device further includes one or more programmable fuses coupled to said sense amplifier delay circuit and further comprising:

setting an initial time adjustment to said base read time delay based on a state of said one or more fuses.

12. The method of claim 11, further comprising:

overriding said initial time adjustment based on said margin select signal.

13. The method of claim 6, wherein said memory cell array is a cache memory coupled to said microprocessor.

14. The method of claim 6, wherein said base read time delay is based on a first operating frequency and a corresponding first operating voltage, and adjusting said base road time delay is based on a second operating frequency and a corresponding second operating voltage.

* * * * *